United States Patent [19]
Klehm, Jr.

[11] 3,708,876
[45] Jan. 9, 1973

[54] VACUUM-HEAT TREATMENT OF PRINTED CIRCUIT BOARDS

[75] Inventor: William G. Klehm, Jr., Farmington, Mich.

[73] Assignee: Burroughs Corporation, Detroit, Mich.

[22] Filed: Jan. 28, 1969

[21] Appl. No.: 794,686

[52] U.S. Cl. ......................29/625, 264/102, 117/61, 117/213

[51] Int. Cl. ..........................B41m 3/08, H05k 3/00

[58] Field of Search ............34/15; 29/625, 626, 494; 264/101, 102; 117/61, 213

[56] References Cited

UNITED STATES PATENTS

| | | | |
|---|---|---|---|
| 3,029,473 | 4/1962 | Greenberg | 264/101 |
| 3,055,096 | 9/1962 | Bertossa | 29/488 |
| 3,452,126 | 6/1969 | Sieron | 264/102 |
| 3,514,842 | 6/1970 | Beuyukian et al | 29/494 |
| 3,528,173 | 9/1970 | Gall | 29/626 |

OTHER PUBLICATIONS

D. A. Radovsyk & B. J. Ronkese, Vacuum Assist for Dip Soldering, IBM Technical Disclosure, Vol. 2 No. 5, Feb. 60.

*Primary Examiner*—Charles W. Lanham
*Assistant Examiner*—D. M. Heist
*Attorney*—Kenneth L. Miller, Wallace P. Lamb, Paul W. Fisher and Edwin W. Uren

[57] ABSTRACT

Relates to the avoidance of electrical discontinuities arising in the production of two-sided printed circuit boards having plated-through-holes and particularly occurring in the use of solder for improving the electrical interconnections. Research disclosed that the cause of these discontinuities lay in the material of the boards surrounding the holes which either included entrapped gas or matter vaporizable under the high temperatures of the liquid solder applied to fill the holes to assure reliable plated-through-hole connections. A vacuum evaporation operation was incorporated in the fabrication process and found highly useful and efficient in the production of reliable hole connections substantially reducing if not completely eliminating any need to apply solder touch-ups to the boards thereafter. Specifically, the boards were treated prior to the soldering of the plated-through holes to a temperature of approximately 250° F while concurrently being exposed to a vacuum of approximately $10^{-2}$ mm Hg for a sufficient time to drive out of the boards all matter vaporizable under such conditions.

9 Claims, 10 Drawing Figures

INVENTOR.
WILLIAM G. KLEHM, JR
BY
Ralzemond B. Parker
ATTORNEY.

VACUUM-HEAT TREATMENT OF PRINTED CIRCUIT BOARDS

CROSS REFERENCE TO RELATED PUBLICATIONS

For an understanding of the art to which this invention relates, reference may be had to PRINTED AND INTEGRATED CIRCUITRY Materials and Processes by Schlabach and Rider and published by the McGraw-Hill Book Company, Inc., copywrited 1963; SOLDERS AND SOLDERING by Howard H. Manko and published by McGraw-Hill Book Company, Inc., copywrited 1964; "Experimental Evaluation of Reliable Soldering Processes" by Browning and Bester appearing in the 1963 Proceedings of the National Symposium on Reliability and Quality Control, pages 211 to 221; "Elimination of Fractures in Plated-Through-Holes Printed Circuit Boards by the Use of Ductile Plating" by Broache and Poch appearing in the *IEEE Transactions on Parts, Materials and Packaging*, December, 1966; PRINTED CIRCUITS HANDBOOK edited by Clyde F. Coombs, Jr. and published by McGraw-Hill Book Company, Inc., copywrited 1967; and "Tips and Techniques for Printed-Wiring Design" by John Cavasin, Jr. in *Machine Design*, April 27, 1967.

BACKGROUND

Workers in the art to which this invention relates have known that the plating and soldering of holes in printed circuit boards are critical processes resulting in a considerable percentage of failures requiring such boards either to be rejected or to undergo a subsequent expensive touch-up soldering operation in order to make the boards serviceable. The referenced publications describe the difficulties and imperfections heretofore encountered and suggest several production procedures which to a certain extent may have alleviated the troubles but still failed to produce uniform, highly reliable plated-through-hole connections which substantially reduce if not eliminate the necessity for the subsequent costly touch-up solder operations practiced by the industry. Past analysis has ascertained that the soldering operation was in some manner responsible for some of the difficulties and imperfections and one referenced publication attributed the fractures occurring in plated-through holes to the sudden thermal expansion of the board due to the heat of soldering and suggested a ductile copper plating be used to accommodate the increase in thickness of the board. Others of the referenced publications attributed the difficulties to entrapment of gases or solutions in the printed circuit boards behind the platings and surmised that the soldering operation generated enough heat to volatilize the solutions. One reference suggested a prebake cycle of 2 hours at 180° F before soldering the boards to eliminate the problem but conceded that hidden materials may be still trapped in the boards. Although helping to a limited extent, these past attempts and suggestions fell far short of providing reliable circuit interconnections between the opposite sides of the boards and failed to eliminate the costly solder touch-up operations found necessary in the practice of this art.

SUMMARY OF THE INVENTION

It is therefore an important object of the present invention to provide an improved method of manufacturing printed circuit boards.

It is another important object of the invention to subject printed circuit boards having plated-through-holes to an improved treatment which assures uniform, highly reliable electrical connections through the holes to the opposite sides of the boards.

It is a further important object of the invention to reduce substantially if not eliminate completely the source of imperfectly plated-through-hole connections in printed circuit boards and in so doing eliminate the necessity of applying to each board a manual soldering touch-up to assure complete filling of each hole in the board.

The above objects and advantages are achieved by the present invention. In the effort of attaining these objects and advantages, it was found upon careful investigation that the source or cause of the difficulties heretofore encountered in the production of printed circuit boards and particularly those with plated-through-holes could be laid mainly if not entirely to the material of the board surrounding each hole rather than to the hole plating operation or the subsequent soldering operation. It was learned in the investigation out of which this invention arose that certain materials in the board would vaporize at the soldering temperature, the gases expelled under this heating environment would issue through cracks and fractures in the plated walls of the holes thus impairing the soldering operation. Moreover, occasionally gases would be entrapped in the subsequently applied solder which would expel portions of the solder from the hole or form a concealed gaseous void in what would otherwise appear to be a satisfactory solder fillet therein. Careful investigation by means of a laboratory apparatus revealed that when a sample plated-through-hole board was placed in a transparent liquid medium such as silicone oil and subjected to a high vacuum evaporation operation, bubbles of gases arose out of the board first along the cut edges thereof and then out of the plated holes therein. From this investigation it was deduced that material in the board was vaporized by the heat of the soldering operation producing gases which interfered with the acceptable production of soldered plated-through-holes in the board. Having discovered the source of the difficulties, it was found upon further experimentation that wholly reliable completely filled soldered fillets could be formed in the plated-through-holes by incorporating in the fabrication of the boards the steps of treating the boards to a vacuum evaporation operation preferably after the plating of the holes and immediately before the boards were subjected to the soldering operation. As a result of this pretreatment of the board in advance of the soldering operation, it was discovered that the plated-through-holes were completely and homogeneously filled with solder thereby eliminating the costly manual touch-up soldering operations practiced by the industry.

Various other objects, advantages and meritorious features of the invention will become fully apparent from the following specification, appended claims and the accompanying drawings wherein:

In the present state of the art, printed-wiring laminates, frequently referred to as printed circuit boards, fall into two broad categories as far as their composition is concerned, namely, paper-based phenolics and glass-based epoxies. Each type has certain advantages and disadvantages where the other does not and both are utilized extensively in this art. A third composition, a paper-based epoxy, is sometimes used as a compromise between the two major types. When used singly, these boards may have their printed-wiring layouts on only one surface and in such instance the soldering pretreatment procedure of this invention may be used to insure electrical connections on one surface of the boards. Where the printing-wiring is applied to both sides of the boards, the industry has extensively adopted the practice of forming holes in the boards opening out through the opposite surfaces and then plating these holes with electrically conductive material, such as copper, so as to connect the wiring on one side of the board with that on the other side. Following this, it has been the practice of the art, as evidenced by the above referenced publications, to introduce liquid solder into the plated-through-holes which would later solidify therein for the purpose of assuring a reliable electrical path between the opposite surfaces of the board. Finally, the art has progressed to the assembly of a plurality of such apertured boards so that a multilayer structure is formed having the holes of the layers in registry with one another. These holes are then plated with a conductive coating and subsequently liquid solder is introduced thereinto for the purpose of forming a solid fillet in each hole for improving the electrical connection intended to be performed by the plating in the hole.

Figure 1:
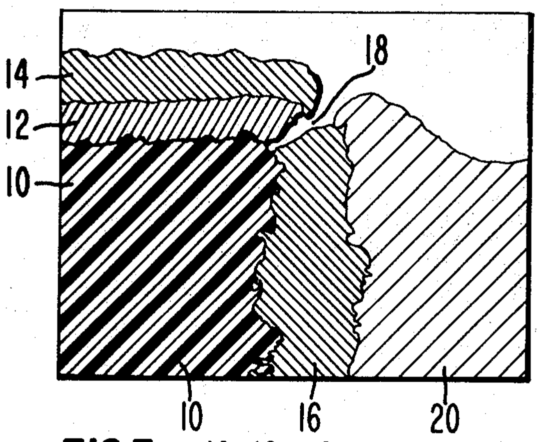
FIG. 1 is a cross-sectional view through a mouth portion of a plated-through-hole of a printed circuit board taken from photomicrographs at about 200 magnification and showing a typical fracturing of the plated connection frequently encountered in the past which the solder fillet failed to bridge.
Figure 2:
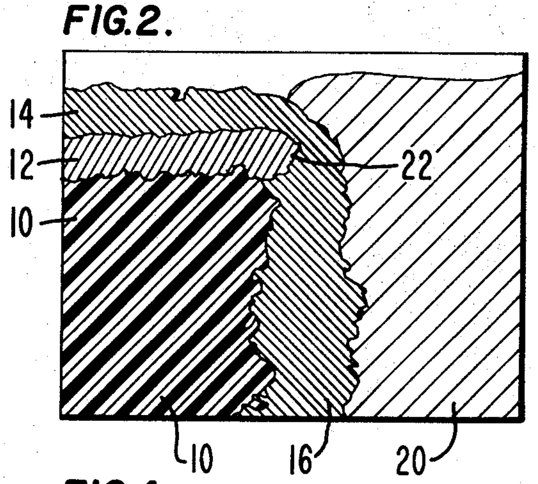
FIG. 2 is a view similar to that of FIG. 1 showing a corner portion of a plated-through-hole from a board manufactured in accordance with this invention.

FIGS. 1 and 2 of the drawing illustrate micro-photographic conditions of two different plated-through-hole connections at about 200 times magnification. FIG. 1 illustrates a frequently encountered discontinuity which will impair if not destroy the electrical connection between the surface wiring and the plating in the hole. FIG. 2 illustrates the desired physical condition for providing a reliable interconnection between the conductive elements of the board. Referring more specifically to the two Figures, the electrical insulated material constituting the board is indicated at 10 and overlaid on one surface thereof is a conductive printed wiring element 12, which in normal scale is usually very narrow and thin. During the fabrication of this board it was subjected to an electroplating operation which laid down a conductive coating 14 on top of the wiring element 12 and a conductive coating 16 on the wall of the hole which is intended to serve as an electrical path between the printed wiring element 12 on one side of the board and a similar printed wiring element on the opposite side of the board. However, at the place indicated at 18 in FIG. 1 a discontinuity is shown which may completely break the electrical connection between the wiring element 12 and the plating 16 in the hole. This fracture may occur as the result of poor plating but usually as the result of the introduction of molten solder 20 into the hole at approximately 450° F. The sudden increase in temperature caused by the entrance of the molten solder into the holes subjects the immediately adjacent areas of the board to a thermal shock which expands the thickness of the board and imposes a strain on the plating in the holes with the likelihood of producing a fracture such as illustrated at 18. Moreover, the solder may fail in its ultimate purpose. Instead of bridging the fracture 18 to repair the connection, the solder may be insufficient or fall away from the fracture as shown in FIG. 1 and thus fail to provide a satisfactory circuit path through the hole.

FIG. 2 represents a similar section through the corner or lip portion of a plated-through-hole board, the like parts of FIGS. 1 and 2 being identified by similar reference characters. By comparison with FIG. 1, it is evident that in the board of FIG. 2 a strong reliable electrical interconnection has been formed not only between the printed element 12 and the plating 16 at the mouth of the hole but also the soldering fillet 20 has completely filled the hole to a level approximately flush with if not higher than that of the printed wiring and over the joint 22 thereby reinforcing the electrical connection between the wiring elements 12 and 16 of the board. FIG. 2 therefore represents the desired result in the fabrication of soldered plated-through-holes which is the purpose of this invention to obtain in every instance.

Figure 3:
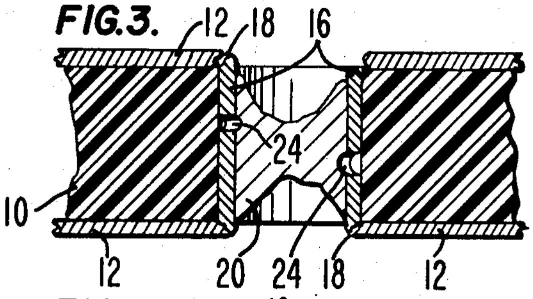
FIGS. 3 and 4 are enlarged cross-sectional views of plated-through-holes of printed circuit boards illustrating different forms of imperfections heretofore encountered in the filling of such holes with solder.
Figure 4:
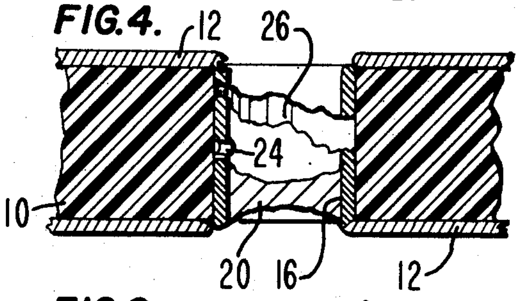

FIGS. 3 and 4 are schematic sectional views illustrating further discontinuities and imperfections encountered in the manufacture of plated-through-hole boards. These two figures are in smaller scale than those of FIGS. 1 and 2 in order to show both sides of the boards. Here again, elements and features common to FIGS. 1 and 2 are identified by the same reference characters in FIGS. 3 and 4, except that plated element 14 is now an unshown part of wiring element 12. In FIG. 3 fractures 18 are illustrated in the upper and lower lip portions of the hole forming a break in the electrical path. In addition apertures or blowout holes 24—24 are shown in the wall plating 16 which are encountered in the production of these boards. Normally such small apertures would not interrupt the electrical path between the opposite sides of the board, but their presence might well weaken the plating in the holes so that in usage vibration or handling may completely rupture the plated coating 16 thus breaking the electrical path. Lastly, FIG. 3 shows the solder 20 only partially filling the hole 14 and bridging only the apertures 24 but failing to extend to the mouths of the hole to cover or bridge the fractures at these places. Frequently, as indicated in the literature referenced hereinabove, gases entrapped in holes or in the board material are likely to blowout some of the solder presenting voids at one or both ends of the holes as illustrated in FIG. 3.

FIG. 4 illustrates a further extreme discontinuity in the electrical interconnections between the opposite sides of the board. Here, the plated through connection 16 has a fracture 26 therein which extends completely around the hole thus completely severing the electrical connection formed by the plating. Moreover, in FIG. 4 the solder 20 which is intended to extend over or bridge such a fracture is so small in volume that it fails in this purpose. Extreme discontinuities of this kind have in the past been attributed to poor plating or to gases entrapped in the hole which when heated by the solder would blowout large portions of the latter.

Figure 5:
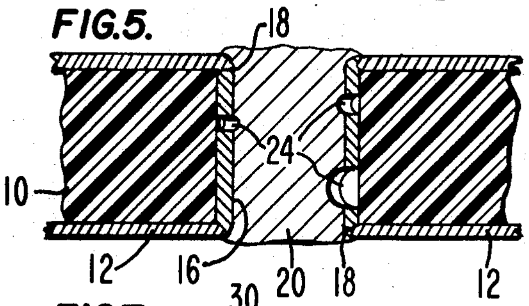
FIGS. 5 and 6 are a pair of views generally like that of FIGS. 3 and 4 but illustrating beneficial results resulting from the incorporation of the invention in the manufacture of printed circuit boards.
Figure 6:
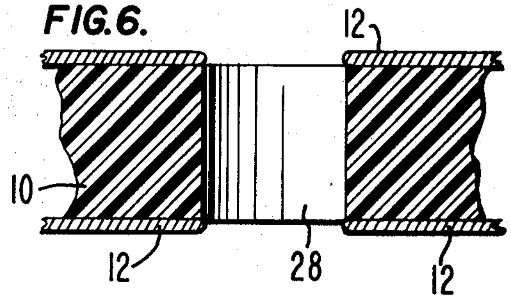

FIGS. 5 and 6 are sectional views illustrating the desired soldering results which is the purpose of this invention to provide. In FIG. 5, although the plated wall 16 of the hole has been perforated at several places 24 the solder 20 not only bridges these holes but also the lip fractures 18 to provide a satisfactory electrical connection. In FIG. 5 the solder fillet completely fills the hole providing a solid body of conductive material thus assuring a high quality, reliable interconnection between the opposite sides of the board. In FIG. 6 a hole 28 is illustrated in the board which does not contain a plated-wall or solder therein. Sometimes, in the plated-through-hole production operation, one or more holes in the board are either missed or such a small amount of conductive material is plated therein as to be completely incapable of forming the desired electrical interconnection. In such instances, the solder sometimes completely fills these holes even in the absence of plated material therein. At the inspection station when a board having holes so formed and soldered is visibly inspected, it would appear that a satisfactory connection had been provided because the hole is filled with solder thus obscuring the lack of hole-plating therein. What is desired, however, is that no soldering occur when no plating occurs so that at the time of the inspection the absence of solder will indicate that the hole has been missed by the plating operation. FIG. 6 is thus representative of the ideal condition where because of no or very little plating in the hole no solder was retained therein thereby making it clearly obvious to the inspector that an electrical failure has occurred for this particular hole and thus enabling it to be corrected.

Figure 7:
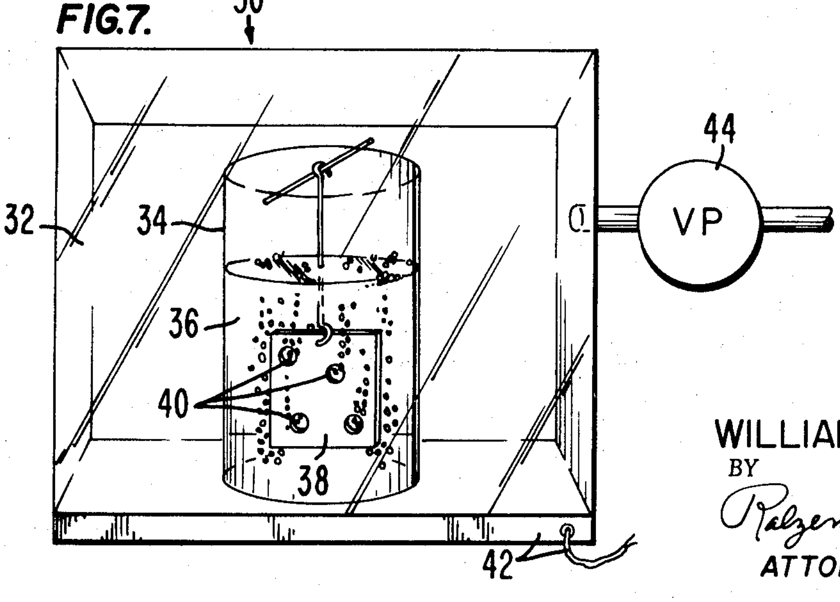
FIG. 7 is a schematic view of a laboratory apparatus utilized in the investigation of the troubles encountered in the production of printed circuit boards and illustrating how the source of trouble was discovered and utilized to improve the manufacturing process in accordance with this invention.

The problem of poor circuit board production, particularly as to plated-through-circuit hole boards, has been an industry-wide consideration for sometime, and in the laboratory studies made to determine the cause I began to suspect that the cause was a physical one arising from the composition of the boards and possibly as the result of the vaporizing of certain materials in the boards at the temperatures at which the liquid solder was applied to fill the holes. To ascertain whether or not this was true, the laboratory apparatus schematically illustrated in FIG. 7 was constructed and operated. The apparatus comprised a gas tight chamber or oven generally indicated at 30 having at least one transparent wall portion 32 through which the interior could be observed. Disposed within the oven was a transparent jar or vessel 34 containing a transparent liquid, such as silicone oil, indicated at 36. Suspended within the oil were one or more sample plated-through-hole boards 38, several holes of which are indicated at 40. Means for heating the oven is indicated at 42, the capability of this means being sufficient to raise the temperature of the immersed board to that at least approximating the temperature of the molten solder later applied to fill the holes. Further associated with the oven was a vacuum pump 44 also indicated by the legend VP. The intake of the pump was connected to the oven as shown in FIG. 7 while the outlet discharged into any suitable way. The vacuum pump had such a capability that it could reduce the pressure in the chamber 30 to below $10^{-2}$ mm Hg.

The oven 30 was heated to increasingly higher temperatures and the air pressure therein decreasingly reduced to very low pressure levels. At approximately the temperature of 250° F and at a vacuum of approximately $10^{-2}$ mm Hg, I observed bubbles rising out of the board 38 first along the cut edges thereof and then from the holes 40 thereof. This confirmed my suspicions that the imperfections and discontinuities encountered in the production of such printed-wiring boards may be caused by the out-gassing of certain materials in the board. Under the heat of the soldering operation certain materials in the boards vaporized and discharged from the board and apparently under such pressures as to damage the plating in the holes impairing if not breaking the electrical connections formed thereby and also to blowing out some of the molten solder introduced into the holes with the intention of assuring good electrical connection.

Confirmation of this analysis was obtained by a comparison test. I selected several sample printed circuit boards having plated-through-holes and ready for soldering and after severing each in half I then subjected one half of each pair to the vacuum evaporation treatment described in connection with the apparatus of FIG. 7 but without immersion in a liquid. In other words, one half section of each severed board was subjected to a pretreatment temperature of approximately 250° F and a vacuum of approximately $10^{-2}$ mm Hg. for 3 to 4 hours, a sufficient length of time to remove substantially all of the materials in the boards which would vaporize under such conditions. Thereafter, each pretreated half section was placed side by side with its untreated half of the same board and run side by side through a conventional wave soldering apparatus to fill their respective plated-through-holes with solder. At the conclusion of the soldering operation I found that in all instances the half sections of all such severed boards subjected to the vacuum evaporation pretreatment were completely filled with solder to such an acceptable degree that no subsequent soldering touch-ups were necessary. However, as for the remaining untreated half sections of these severed boards, the usual number of voids in the plated-through-holes were observed indicating that unsatisfactory solder fillets had been formed therein requiring solder touch-ups to bring these hole connections into acceptable condition. Moreover, electrical tests of each pair of half sectioned boards disclosed that in all instances those half sections exposed to the vacuum evaporation treatment were 100 percent satisfactory, whereas their respective untreated complementing half sections had the usual number of electrical path failures and solder voids running several to a half section on the average.

A further experiment was made to confirm the feasibility of this process. A batch of 1,000 printed circuit boards having plated-through-holes was subjected to the vacuum baking step hereinabove described preparatory to the application of solder for filling the holes. Of the approximately 1 million holes in these boards, only eight holes were found defective and requiring manual soldering touch-ups in accordance with the practice in this art. This compares extremely favorably with the usual printed circuit board production where, for example, from one supplier of printed circuit boards having plated-through-holes there resulted an average of 15 to 20 defective soldered holes in each board requiring manual touch-ups to assure as best as could be visually determined that a reliable electrical path had been established through each hole.

Figures 8, 9, 10:
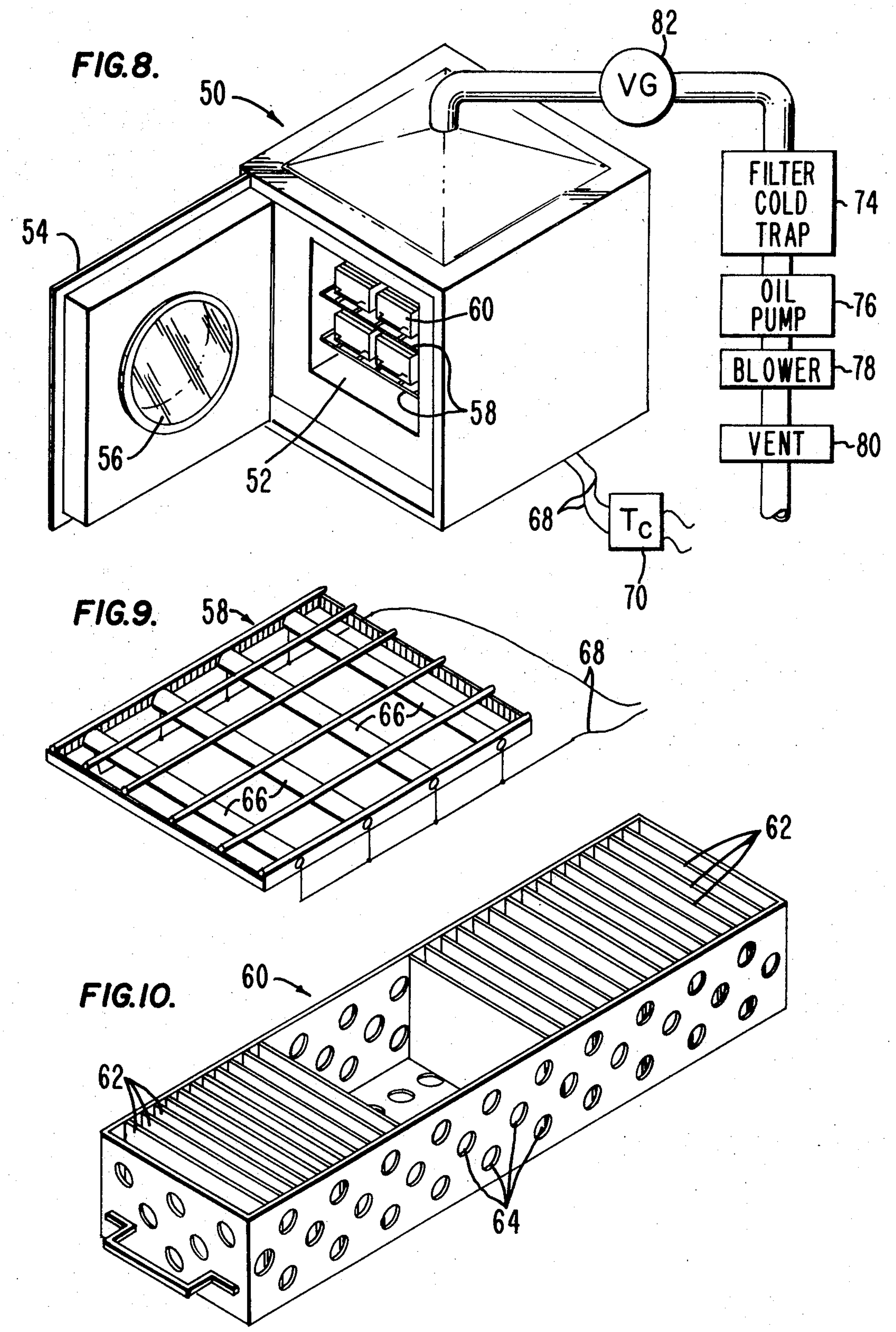
FIG. 8 is a perspective view schematically illustrating a vacuum furnace suitable for mass treatment of printed circuit boards in accordance with this invention.
FIG. 9 is a perspective view of one of the shelves in the treatment chamber of the vacuum furnace.
FIG. 10 is a perspective view of a perforated box suitable for holding a plurality of printed circuit boards while subjected to the vacuum evaporation treatment in the furnace.

For comparatively large batch processing of printed circuit boards incorporating the vacuum evaporation treatment of this invention, the apparatus of FIGS. 8 to 10 is deemed highly satisfactory. These Figures schematically illustrate a form of vacuum furnace equipment which is currently available on the market. For example, several types of such vacuum ovens or furnaces are produced by the Sunbeam Vacuum Furnace Corporation of North Billerica, Massachusetts. The vacuum furnace illustrated at 50 in FIGS. 8 to 10 may have an interior dimension of 4′ × 4′ × 4′ for forming a chamber 52 for holding a large number of printed circuit boards to be treated in accordance with this invention. A hinged front door 54 is provided with a sealed glass porthole 56 for visual observation of the interior of the furnace. The chamber 52 contains several shelves 58, one of which is shown schematically in FIG. 9 as being an open frame or grid to allow for the flow of gas therethrough and which may be permanently installed in the chamber. The shelving should be formed of material which will not gasify under the heat and high vacuum conditions at which the furnace is operated and should be thoroughly cleaned of all grease and foreign material. Stainless steel is a highly suitable material for this purpose.

The printed circuit boards to be treated are placed in portable elongated trays, one of which is illustrated at 60 in FIG. 10. The printed circuit boards, indicated at 62, are stacked preferably vertically within the tray and slightly spaced apart from one another. The tray should be of opened or reticulated metal work, preferably also formed of stainless steel, in order to allow free flow of gaseous substances, as exemplified by the perforations 64 formed in the walls and the bottom thereof.

Suitable equipment is provided for raising the temperature in the chamber and concurrently reducing the gas pressure therein. A heating provision is schematically illustrated in FIG. 9 where certain parts of the shelves are shaped to contain electrical heating resistances which are enclosed or embedded within ceramic material. For example, the cross members 66 of the shelves are constructed in this manner and receive electric current by way of the leads 68—68 from a suitable source of electrical energy. As shown in FIG. 1 these leads extend to the exterior of the furnace and through a temperature control device in the form of a current regulator 70 bearing legend TC.

The reduction in the gas pressure within the chamber may be obtained in a conventional manner and for this purpose a conduit or pipe 72 is provided which opens into the upper portion of the chamber 52 and extends exteriorly of the furnace to apparatus for producing a high vacuum in the chamber. Suitable equipment of this nature includes a condenser 74 in the form of a filter cold trap and a vacuum producing oil pump 76 which is continuously operated during the treatment period to draw out any gases present in the chamber. Preferably, for the practice of this invention, the vacuum pump reduces the pressure in the chamber 52 to a vacuum level of at least one Torr. A desirable vacuum condition has been found to be approximately $10^{-2}$ mm Hg as previously set forth herein. A blower 78 is connected to the outlet of the pump 76 to facilitate the removal of the outgassed material delivered by the pump to a vent 80. A vacuum gauge 82 is connected to the conduit 72 near its connection to the furnace to visually indicate the vacuum conditions in the chamber 52.

In the operation of the apparatus of FIG. 8 to carry out the processes of this invention, the trays 60 loaded with the printed circuit boards in the upright manner previously described are placed on the shelves 58 in the chamber. Thereafter, with the door 54 closed and everything properly sealed the vacuum furnace 50 is readied for operation. The temperature control 70 is set to a maximum limit which may, as previously described, be approximately 250° F. The vacuum pump will be set to lower the gas pressure within the chamber to below one Torr and for example to a vacuum condition of approximately $10^{-2}$ mm Hg. It was found in the experiments conducted in connection with this invention that for the operating conditions of a temperature of 250° F and a high vacuum of $10^{-2}$ mm Hg that a time period of 3 to 5 hours was usually sufficient to completely outgas the boards for the purpose of this invention. Following the batch treatment of the boards within the vacuum furnace 50 they are removed, and without further treatment insofar as the composition of the boards is concerned they are subjected to the soldering operation for filling the holes with molten solder. As in conventional practice, the boards are then cooled with the result that the solder hardens and forms solid electrically conductive fillets completely filling the plated-through-holes of the boards, such as illustrated at 20 in FIGS. 2 and 5.

The three control factors of the vacuum baking treatment, namely, temperature, vacuum and time, may be varied within limits. For example, a higher temperature can be applied to the printed circuit boards in chamber 52 so long as the temperature does not exceed the fusion temperature of the boards or otherwise cause a detrimental change therein. Such higher temperatures could shorten the duration of the treatment or enable less vacuum to be applied, or both. Similarly, a higher vacuum below $10^{-2}$ mm Hg applied to the chamber 52 will enable the duration of the treatment to be reduced or enable a lower temperature to be used, or both. Lastly, an increased time period for the treatment of the boards in the chamber, such as 10 to 12 hours, will enable the treatment to be practiced at lower temperatures and less vacuum. Although not intending to be limiting but merely to set forth a practical range, the temperature for the vacuum oven may be set between 212° F and a temperature no higher than that which would be detrimental to the boards and any components thereon.

The vacuum evaporation treatment of this invention is applicable to both paper-based phenolic boards and glass-based epoxy boards and to similar substrate compositions utilizable for printed circuit boards. Whatever the basic material of the boards is, this pretreatment operation before solder is flowed into the plated-through-holes results in boards free of substantially all material therein which would vaporize at the temperatures leading up to and including that of the molten solder used for filling the holes. Whether considered as an intermediary or final product, the result is a high vacuum baked printed circuit board which is dimensionally and compositionally stable not only at the time of the application of the liquid solder thereto but also in the subsequent use of the soldered board in electrical equipment for which it is designed.

With the inclusion of this vacuum evaporation step in the process of making printed circuit boards and the like, any matter forming part of the board's original composition or subsequently introduced thereinto which is vaporizable at the soldering temperature is substantially completely expelled from the board. By this treatment, the imperfections and discontinuities heretofore encountered as a result of the soldering operation are avoided, thereby eliminating substantially all soldering touch-ups and repairs frequently found necessary on many printed circuit boards. The avoidance of the costly and time consuming touch-up operations reduces the over all time for fabricating printed circuit boards. The result is a greater production of such boards in a given time interval and at lower cost concomitantly with an improved, more reliable product.

While particular embodiments of the invention have been shown or discussed, it will be understood, of course, that it is not desired that the invention be limited thereto since modifications may be made. For example, although the high vacuum evaporation treatment is illustrated herein as being applied to printed circuit substrates or boards of one layer, the treatment is similarly effective when applied to multilayer apertured boards before solder is introduced into the registered plated-through holes thereof. It is, therefore, contemplated by the appended claims to cover any such modifications as fall within the true spirit and scope of the invention.

I claim:

1. In the method of making printed circuit boards wherein such boards are composed of a plastic composition and bear electrical conductors on opposite surfaces thereof connected by one or more holes extending through the boards and wherein molten solder is introduced into the holes formed therein, the step of subjecting the boards to a vacuum evaporation treatment prior to the introduction of solder into the holes which includes subjecting the boards to a temperature approaching but below that which would detrimentally affect the material of the boards and while concurrently subjecting the boards to a vacuum of at least 1 Torr.

2. In the method of making printed circuit boards composed at least in part of plastic material and bearing printed wiring on opposite surfaces thereof connected by one or more holes lined with electrically conductive material, the step of subjecting such boards prior to the application of molten solder thereto to a vacuum evaporation treatment operating at a temperature of approximately 250° F and at a vacuum of approximately $10^{-2}$ mm Hg for the duration of time sufficient to drive out substantially all material in the boards vaporizable under such conditions.

3. In the method of manufacturing printed circuit boards wherein such boards are composed of a plastic composition and bear conductors on surfaces thereof connected by plated-through-holes, the method of pretreating each such hole plated board prior to the application of solder to fill the holes comprising the steps of placing the board in an air-tight chamber, heating the chamber to a temperature above 212° F but below that at which the material of the board would be detrimentally affected thereby and concurrently lowering the vacuum in the chamber below 1 Torr for a time sufficient to drive out substantially all vaporizable matter in the board.

4. The method of preparing plastic composition boards having printed conductors on surfaces thereof connected by plated-through-holes for the application of liquid solder for filling the holes which comprises subjecting each board to a concurrent heat and vacuum treatment to outgas the board, the temperature of the treatment being above 212° F but below the temperature which would detrimentally affect the composition of the board and the vacuum being less than 1 Torr, and then thereafter without further treatment of the boards filling the plated-through-holes of the board with liquid solder.

5. The invention described in claim 4 characterized in that the temperature of the treatment is approximately 250° F and the vacuum is approximately $10^{-2}$ mm Hg.

6. In the method of manufacturing printed circuit boards wherein such boards are composed of a plastic composition and bear conductors on surfaces thereof connected by plated-through-holes, the method of pretreating such boards prior to the application of solder to fill the holes including the steps of subjecting such boards to a vacuum evaporation treatment of several hours duration at a temperature above 212° F but below that at which the material of the board would be detrimentally affected thereby and concurrently at a vacuum at least 1 Torr, and then thereafter filling the plated-through-holes with liquid solder.

7. The method of outgassing plastic composition boards having printed conductors on the exterior surfaces thereof and containing plated-through-hole interconnections which comprises the steps of loading a vacuum chamber with a batch of such printed conductor boards of like composition, heating the chamber to a temperature above 212° F but below the temperature which would detrimentally affect the boards therein, lowering the vacuum in the chamber below 1 Torr while the boards are so heated in the chamber, and maintaining such temperature and vacuum conditions of the chamber for at least approximately 3 to 5 hours.

8. In the method of fabricating plastic composition boards which bear printed wiring on opposite surfaces thereof and are electrically connected by plated-through-holes and which are subjected to a soldering operation filling the holes with molten solder, the steps of preparing such boards for the soldering operation which comprises enclosing the boards within an airtight chamber, heating the chamber to a temperature higher than 212° F but no higher than that which would detrimentally affect the boards, and while the boards are so being heated maintaining the chamber in a high vacuum condition of less than 1 Torr.

9. The invention described in claim 8 characterized in that the temperature to which the chamber is heated is approximately 250° F and that the vacuum therein is approximately $10^{-2}$ mm Hg, and further characterized in that such temperature and vacuum levels in the chamber are maintained until substantially all material in the boards vaporizable under such conditions are outgassed therefrom.

* * * * *